United States Patent
Nakamura et al.

(10) Patent No.: US 8,652,399 B2
(45) Date of Patent: *Feb. 18, 2014

(54) SPUTTERING TARGET FOR PRODUCING METALLIC GLASS MEMBRANE AND MANUFACTURING METHOD THEREOF

(75) Inventors: Atsushi Nakamura, Ibaraki (JP); Masataka Yahagi, Ibaraki (JP); Akihisa Inoue, Miyagi (JP); Hisamichi Kimura, Miyagi (JP); Shin-ichi Yamaura, Miyagi (JP)

(73) Assignees: JX Nippon Mining & Metals Corporation, Tokyo (JP); Tohoku University, Miyagi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/854,683

(22) Filed: Aug. 11, 2010

(65) Prior Publication Data

US 2010/0320085 A1 Dec. 23, 2010

Related U.S. Application Data

(62) Division of application No. 11/719,229, filed as application No. PCT/JP2005/020278 on Nov. 4, 2005.

(30) Foreign Application Priority Data

Nov. 15, 2004 (JP) ................................. 2004-330411

(51) Int. Cl.
*C22C 1/04* (2006.01)
(52) U.S. Cl.
USPC ............ 419/26; 419/23; 419/61; 204/298.13; 148/403; 75/246
(58) Field of Classification Search
USPC ......................................................... 419/26
See application file for complete search history.

(56) References Cited

U.S. PATENT DOCUMENTS 4,824,481 A * 4/1989 Chatterjee et al. .............. 75/246
4,940,966 A 7/1990 Pettigrew et al.
(Continued)

FOREIGN PATENT DOCUMENTS

| JP | 2001-295035 A | 10/2001 |
| JP | 2003-201560 A | 7/2003 |
| WO | 2005/012591 A1 | 2/2005 |

OTHER PUBLICATIONS

Fan et al., "Deformation Behavior of Zr-Based Bulk Nanocrystalline Amorphous Alloys", Physical Review B, vol. 61, No. 6, pp. R3761-R3763, Feb. 1, 2000.

(Continued)

*Primary Examiner* — Jessee R. Roe
*Assistant Examiner* — Christopher Kessler
(74) *Attorney, Agent, or Firm* — Howson & Howson LLP

(57) ABSTRACT

A sputtering target for producing a metallic glass membrane characterized in comprising a structure obtained by sintering atomized powder having a composition of a ternary compound system or greater with at least one or more metal elements selected from Pd, Zr, Fe, Co, Cu and Ni as its main component (component of greatest atomic %), and being an average grain size of 50 μm or less. The prepared metallic glass membrane can be used as a substitute for conventional high-cost bulk metallic glass obtained by quenching of molten metal. This sputtering target for producing the metallic glass membrane is also free from problems such as defects in the metallic glass membrane and unevenness of composition, has a uniform structure, can be produced efficiently and at low cost, and does not generate many nodules or particles. Further provided is a method for manufacturing such a sputtering target for forming the metallic glass membrane.

4 Claims, 5 Drawing Sheets

(56) References Cited

U.S. PATENT DOCUMENTS

| | | |
|---|---|---|
| 4,960,651 A | 10/1990 | Pettigrew et al. |
| 4,992,095 A | 2/1991 | Nate et al. |
| 5,785,828 A | 7/1998 | Yamada et al. |
| 5,882,493 A | 3/1999 | Iwasaki et al. |
| 6,096,640 A | 8/2000 | Hu |
| 6,127,016 A | 10/2000 | Yamada et al. |
| 6,280,684 B1 | 8/2001 | Yamada et al. |
| 6,503,592 B1 | 1/2003 | Yamada et al. |
| 7,789,948 B2 * | 9/2010 | Nakamura et al. .................. 96/4 |
| 2002/0106297 A1 | 8/2002 | Ueno et al. |
| 2003/0126804 A1 | 7/2003 | Rosenflanz et al. |
| 2004/0256035 A1 | 12/2004 | Yamakoshi et al. |
| 2006/0037680 A1 | 2/2006 | Yamakoshi |
| 2006/0137782 A1 | 6/2006 | Yamakoshi et al. |
| 2006/0185771 A1 | 8/2006 | Inoue et al. |
| 2009/0064861 A1 | 3/2009 | Nakamura et al. |

OTHER PUBLICATIONS

Kakiuchi et al., "Application of Zr-Based Bulk Glassy Alloys to Golf Clubs", Materials Transactions, vol. 4, No. 4, pp. 678-681, Mar. 15, 2001.

Mathaudhu et al., "Progress in Consolidation of Amorphous Zr-Based Powder into Bulk Metallic Glass", Material Society Research Symposium Proceedings, vol. 754, pp. CC3.5.1-CC3.5.8, 2003 (month unknown).

Gu et al., "Structure of Shear Bands in Zirconium-Based Metallic Glasses Observed by Transmission Electron Microscope", Material Society Research Symposium Proceedings, vol. 754, pp. CC7.9.1-CC7.9.6, 2003 (month unknown).

* cited by examiner

SPUTTERING TARGET FOR PRODUCING METALLIC GLASS MEMBRANE AND MANUFACTURING METHOD THEREOF

CROSS REFERENCE TO RELATED APPLICATIONS

This application is a divisional of co-pending U.S. patent application Ser. No. 11/719,229 which is the National Stage of International Application No. PCT/JP2005/020278, filed Nov. 4, 2005, which claims the benefit under 35 USC §119 of Japanese Application No. 2004-330411, filed Nov. 15, 2004.

BACKGROUND OF THE INVENTION

The present invention relates to a sputtering target for producing a metallic glass membrane that generates few nodules or particles, and to its manufacturing method.

An amorphous metallic glass thin membrane can be used as a hydrogen separation membrane or a magnetic film. Nevertheless, metallic glass is a multi-component system of a ternary compound system or greater, and there are problems with the conventional manufacturing method of a target in that segregation will occur during melting or casting, or crystallites will grow during solidification.

Such segregation and grown crystallites will cause the generation of nodules and particles, and there is a problem in that the sputtered membrane would be defective. Further, adverse effects are also inflicted on the sputtering characteristics.

In recent years, there is increasing demand for efficiently separating hydrogen in fuel cells and other items. Generally speaking, since hydrogen produced from fossil fuel or water contains various impurities due to its manufacturing method, it is necessary to perform purification upon separating such impurities in order to obtain high purity hydrogen.

As the purification method, the PSA (Pressure Swing Adsorption) method, membrane separation process, cryogenic distillation method, absorption method and the like may be used. Among the above, the membrane separation process employing a metallic membrane is the only process that is able to manufacture ultrahigh purity hydrogen, which can be put into practical application, at a high yield and with sufficient speed.

As the hydrogen separation membrane, numerous materials that do and do not contain Pd (since Pd is costly) have been proposed in the past. For instance, refer to "Developmental Status of PEFC Electrode, Separator and Hydrogen Separation Membrane Employing Metallic Glass" written by Naotsugu Meguro published in Fuel Cells, Vol. 2, No. 2, 2003, pages 13 to 17. In particular, there is indication that a Ni—Nb—Zr metallic glass alloy is effective. For instance, refer to "Hydrogen Permeation Characteristics of Ni—Nb—Zr Metallic Glass Alloy" written by Shinichi Yamaura et al. published in (680) The Japan Institute of Metals, Spring Convention Lecture Summary (2003), page 346 and the publication of Shinichi Yamaura et al. titled "Hydrogen Permeation Characteristics of Melt-Spun Ni—Nb—Zr Amorphous Alloy Membranes" in Materials Transactions, Vol. 44, No. 9 (2003) pp. 1885-1890. Although the ultrafine processing technique, in particular the deposition technique, is primarily used for forming a hydrogen gas separation membrane, since even the crystal grain boundary of the formed film will become a problem in ultrafine processing, demanded is a deposition method capable of forming a film without a crystal grain boundary; that is, an amorphous membrane or an equivalent film, upon forming a thin membrane.

Meanwhile, as methods of manufacturing bulk metallic glass, proposed are a water quenching method of obtaining virgulate metallic glass by quenching the molten metal enclosed in a silica tube, a method of performing arc melting and quenching with a water-cooled copper mould, a clamping casting method of obtaining metallic glass by melting metal on a copper mold and thereafter pressing this with a cope and quenching the product, a method of performing injection molding at high pressure and quenching this in a copper mold, and a method of manufacturing a metallic glass wire rod by solidifying molten metal on a rotating disk. For instance, refer to "Manufacturing Method of Bulk Metallic Glass" published in Functional Material, June 2002 Edition, Vol. 22, No. 6, pages 26 to 31.

Nevertheless, since each of these manufacturing methods is a manufacturing method from molten metal and is subject to quenching, it is necessary to devise the apparatus to meet the quenching conditions, and there is a drawback in that the cost would be extremely high. Further, even when forming a thin membrane, there are limitations, and there is a problem in that it was only possible to form a thin membrane of up to 30 µm in the past.

SUMMARY OF THE INVENTION

In light of the above, an object of the present invention is to provide a sputtering target for producing a metallic glass membrane which can be used as a substitute for conventional high-cost bulk metallic glass obtained by quenching of molten metal, is free from problems such as defects in the metallic glass membrane and unevenness of composition, has a uniform structure, can be manufactured at low cost, and does not generate many nodules or particles. Another object of the present invention is to provide the manufacturing method of such a sputtering target for producing a metallic glass membrane.

In order to achieve the foregoing objects, the present invention provides a sputtering target for producing a metallic glass membrane characterized in comprising a structure obtained by sintering atomized powder having a composition of a ternary compound system or greater with at least one or more metal elements selected from Pd, Zr, Fe, Co, Cu and Ni as its main component (component of greatest atomic %), and being an average grain size of 50 µm or less. The crystallite size from XRD (X-ray diffraction) is 10 Å to 200 Å and a segregated crystal of 1 µm or larger does not exist.

The present invention also provides a method of manufacturing a sputtering target for producing a metallic glass membrane including the step of sintering atomized powder having a composition of a ternary compound system or greater with at least one or more metal elements selected from Pd, Zr, Fe, Co, Cu and Ni as its main component (component of greatest atomic %), and being an average grain size of 50 µm or less. The crystallite size from XRD (X-ray diffraction) is 10 Å to 200 Å, and the average grain size of the atomized powder is 50 µm or less.

The sputtering target for producing a metallic glass membrane and its manufacturing method according to the present invention yield a superior effect in that it is possible to obtain a target with high density and a uniform structure according to the sintering method, and, when sputtering is performed using this target, the target surface after sputtering will become a smooth eroded surface, evenness (uniformity) of the film will be favorable, and there is hardly any generation of arcing or particles.

Further, the present invention yields significant effects in that it is possible to make the thickness of the thin membrane much thinner than the bulk body obtained from a conventional molten metal quenching method, the size of the thin membrane can be enlarged without limitation, and the thin membrane can be manufactured at low cost.

DETAILED DESCRIPTION OF THE INVENTION

Figure 1:
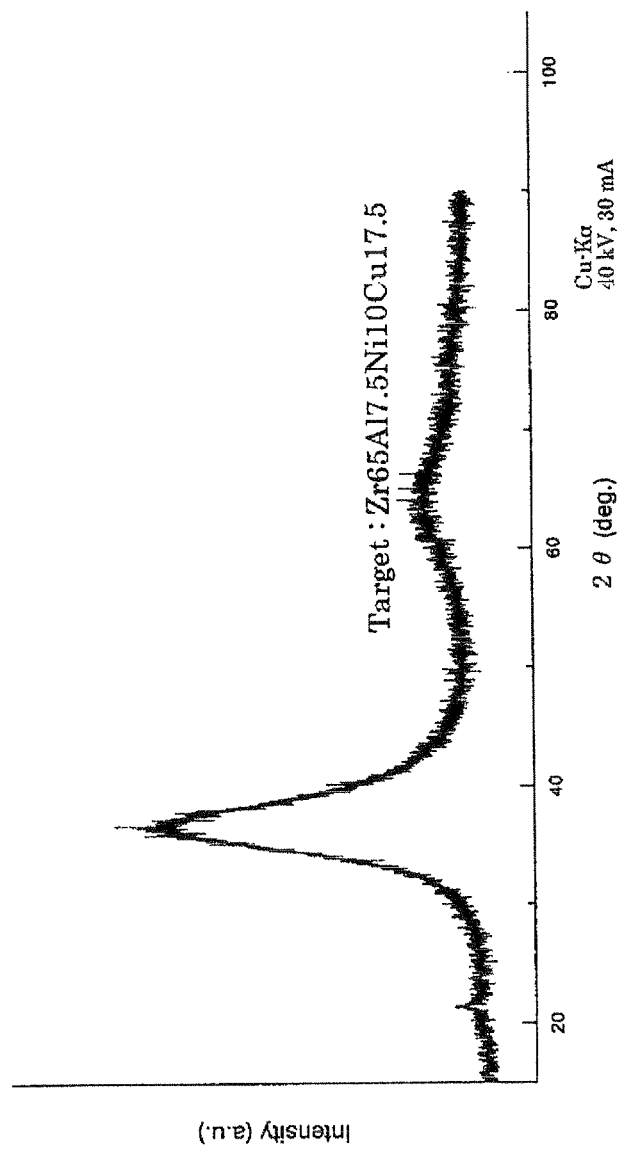
FIG. 1 is a diagram showing the XRD (X-ray diffraction) profile of the target of Example 1.

The sputtering target for producing a metallic glass membrane of the present invention comprises a composition of a ternary compound system or greater with at least one or more metal elements selected from Pd, Zr, Fe, Co, Cu and Ni as its main component (component of greatest atomic %).

With this metallic glass composition, at least one or more metal elements selected from Pd, Zr, Fe, Co, Cu and Ni are used as its main component (component of greatest atomic %). When other elements are used as the main component, the amorphous stability of the amorphous membrane obtained by sputtering will be inferior, and crystallization will occur easily. When crystallization occurs easily, the mechanical strength and heat characteristics will deteriorate.

In order to make this membrane function as a metallic glass membrane such as a hydrogen separation membrane, it is desirable that the film thickness is 10 µm or less. This is because if the film thickness exceeds 10 µm, the function as a metallic glass membrane such as a hydrogen separation membrane will deteriorate.

Even from the perspective that the limit of thinning the thin membrane obtained with the molten metal quenching method is 30 µm, it is evident that the present invention is dramatically superior.

A significant characteristic of the sputtering target for producing a metallic glass membrane of the present invention is that it comprises a structure obtained by sintering atomized powder having an average grain size of 50 µm or less.

Obtained is an amorphous membrane that does not show a peak in XRD (X-ray diffraction) even though it is a membrane obtained by sputtering a sintered target as described later.

Generally speaking, the sputtering method is an effective method as a deposition method since the composition, structure, property and so on of the target are directly reflected on the characteristics of the thin membrane. This composition is reflected on the sputtered membrane obtained by sputtering the target of the present invention, and it is thereby possible to form a favorable metallic glass membrane.

With this target, it is possible to make the crystallite size sought from XRD (X-ray diffraction) to be 10 to 200 Å. Moreover, this target is characterized in that a segregated crystal of 1 µm or larger does not exist. If the crystal grain size of the target itself is small, the surface roughness subject to sputtering erosion will become smooth, and this will yield an effect of inhibiting the generation of particles that aggravate the yield of products.

In particular, an amorphous state is the ultimate structural form for reducing particles. Further, the amorphization and ultra-refinement of the structure will improve the uniformity of the target structure and composition, and products employing this are characterized in that they will not encounter problems such as non-uniformity of composition and the like.

The sputtering target for producing a metallic glass membrane of the present invention can be manufactured by sintering gas atomized powder having a composition of a ternary compound system or greater with at least one or more metal elements selected from Pd, Zr, Fe, Co, Cu and Ni as its main component (component of greatest atomic %) as described above.

In particular, by using atomized powder having an average grain size of 50 µm or less, it is possible to reduce the crystallite size of the target, and inhibit the segregation of the target.

The raw material of the foregoing component, for instance, is melted (alloyed) via sealed ampoule melting, arc melting, or high frequency melting, the obtained alloy is re-melted, and, in certain cases, the foregoing raw material melting process is used as is to prepare alloy powder based on an atomization technique such as gas atomization, water atomization, or oil atomization.

Upon manufacturing gas atomized powder, for instance, argon gas is used as the injection gas and injected from a 0.8 mmφ quartz nozzle. The atomized gas pressure, for example, is 80 kgf/cm$^2$, and the molten metal gas pressure is 0.3 kgf/cm$^2$ upon manufacturing this gas atomized powder.

As the sintering (Spark Plasma Sintering: SPS) conditions, pressure of 600 MPa, and a temperature that is of a crystallization temperature or less are adopted (conditions are changed according to the composition). The foregoing gas atomization and sintering conditions may be arbitrarily changed according to the material, and are not limited to the foregoing conditions.

When setting the sintering conditions, this is basically conducted between the crystallization temperature and glass transition point temperature, and it is desirable to perform sintering near the glass transition point if the sintering density rises to a level that will not cause any practical problems (for instance, a relative density of 90% or higher). Further, it is desirable to keep the heating time during sintering as short as possible in order to maintain the glass state.

This alloy powder is subject to hot pressing or spark plasma sintering (SPS) in order to manufacture a target. With the sputtering target for producing a metallic glass membrane of the present invention obtained by sintering, it is possible to make the crystallite size sought from XRD (X-ray diffraction) 1 nm to 20 nm.

The manufactured sintered body is processed into a prescribed shape (surface processing such as machining and polishing) in order to obtain a target. The obtained sputtering target of the present invention had an ultra-fine nano-size uniform structure.

When sputtering is performed using this kind of a target, significant effects are yielded such as being able to realize favorable membrane evenness (uniformity), inhibit the generation of arcing and particles, and even improve the quality of sputtering deposition.

The sputtering target of the present invention does not have to be limited to the deposition of an ultrafine processing technique, and may be used in an amorphous thin membrane or a crystalline thin membrane as a matter of course.

EXAMPLES

Examples of the present invention are now explained. Incidentally, these examples are merely illustrative, and the present invention shall in no way be limited thereby. In other words, the present invention shall include the various modes and modifications covered by the technical spirit of this invention.

Examples 1-8

A composition of a ternary compound system or greater with at least one or more metal elements selected from Pd, Zr, Fe, Co, Cu and Ni as its main component (component of greatest atomic %) was mixed in a specified quantity as shown in Table 1 and melted in order to prepare a mother alloy. Subsequently, this alloy was melted, and the molten metal was sprayed from a 0.8 mmφ quartz nozzle by using argon gas as the injection gas to manufacture atomized powder.

Here, the atomized gas pressure was 80 kgf/cm$^2$, and the molten metal gas pressure was 0.3 kgf/cm$^2$. Thereby, atomized powder having a median size of D50 (34 to 45 μm) shown in Table 1 was obtained.

Subsequently, the atomized powder was filled in a graphite die, and subject to hot pressing and densified under the conditions of an Ar atmosphere, surface pressure of 300 kg/cm$^2$, temperature of 520° C., and retention time of 1 hour. The obtained sintered body had a relative density of 95% or higher, and a high density sintered body was obtained.

The sintered body was processed into a 6-inch, 6 mmt target. The XRD (X-ray diffraction) profile of the obtained target is shown in FIG. 1 (only Example 1 is shown). The other Examples attained the same result (omitted).

Based on the profile of each Example, the average crystallite size was calculated from Scherrer's formula. The average crystallite size was 10 to 120 Å (1 to 12 nm) as shown in Table 1, respectively.

Figure 2:
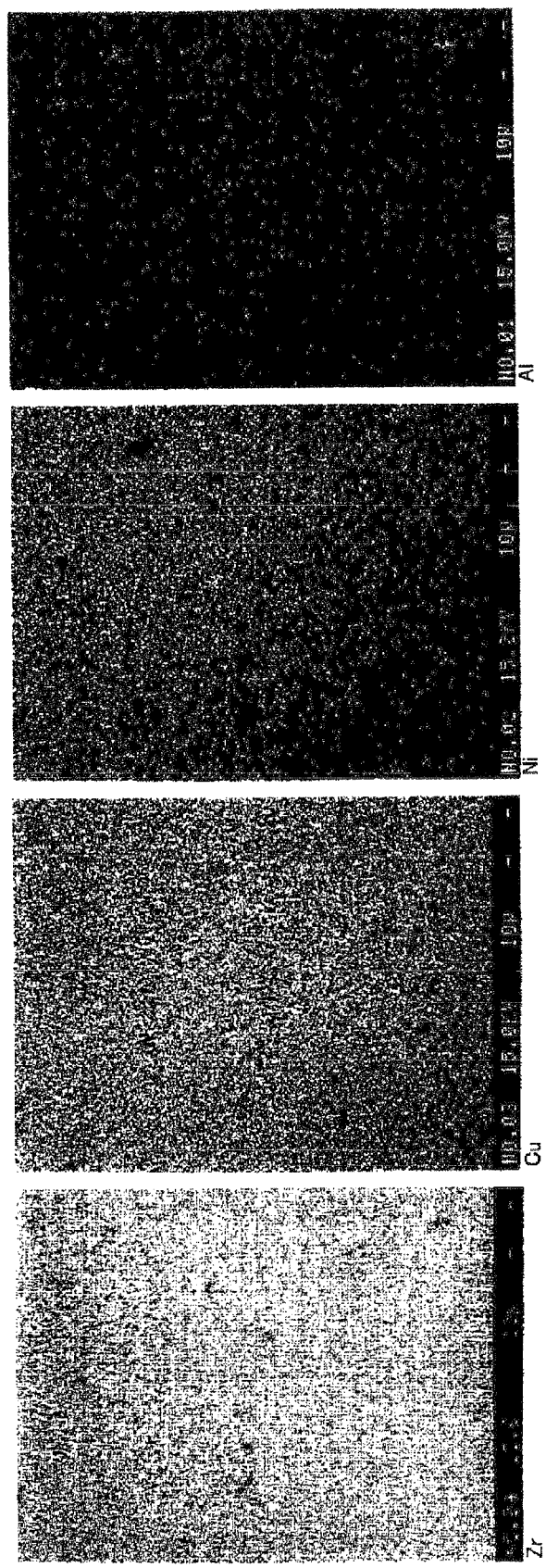
FIG. 2 is a diagram showing the segregation state of the respective elements based on EPMA of the target of Example 1.

Further, evaluation of the segregation state of the respective elements based on EPMA regarding Example 1 is shown in FIG. 2. It is evident that segregation cannot be acknowledged from FIG. 2, and the dispersion is uniform. No segregation could be acknowledged in the other Examples as well, and it was confirmed that the respective elements were distributed uniformly (not shown).

Figure 3:
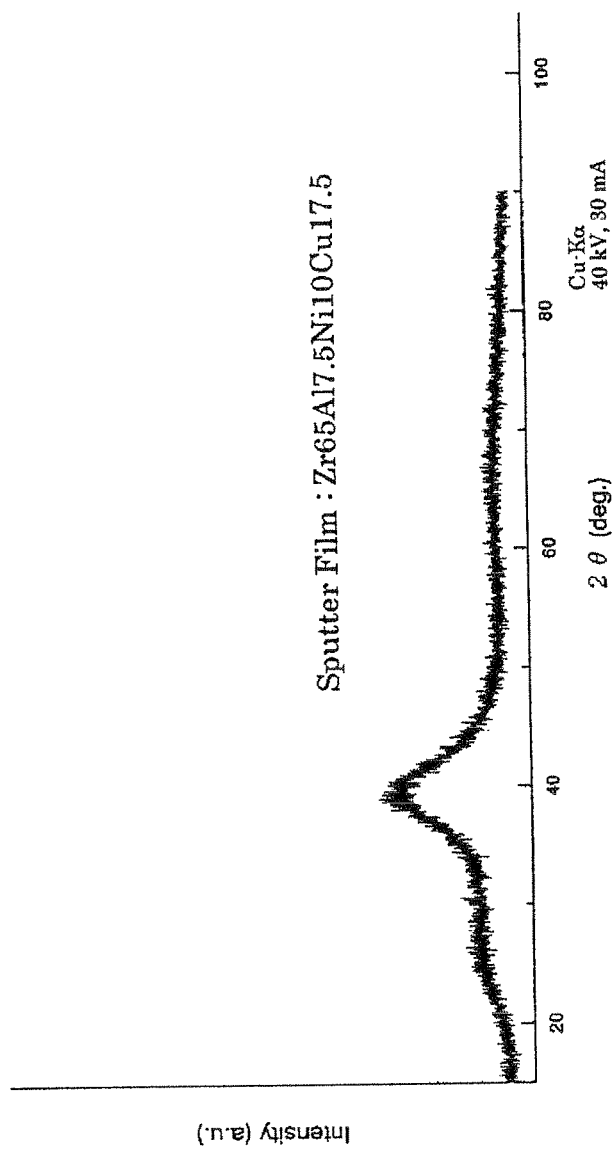
FIG. 3 is a diagram showing the XRD measurement result of the membrane when sputtering is performing with the target of Example 1.

Subsequently, using the target of Example 1, DC sputtering was performed under the conditions of pure Ar, 0.5 Pa and 300 W in order to form a metallic glass membrane. The film thickness after deposition was 1 μm. The XRD measurement result of the sputtered membrane is shown in FIG. 3.

The film evenness (uniformity) was favorable, and the generation of arcing and particles could hardly be acknowledged. Further, nodules could not be observed in the target after sputtering, and a smooth eroded surface was obtained. The surface roughness Ra of the target after sputtering was 0.25 μm.

As with Example 1, the other Examples also showed favorable film evenness (uniformity), and the generation of arcing and particles could hardly be acknowledged. Further, nodules could not be observed in the target after sputtering, and a smooth eroded surface was obtained. The surface roughness of the target after sputtering was 0.12 to 0.34 μm. The results are collectively shown in Table 1.

Comparative Examples 1-12

The materials of the composition shown in Comparative Examples 1-12 were mixed in a specified quantity as shown in Table 1 and Ar-melted and casted in order to prepare an ingot having a relative density 88.4 to 99.8%.

This ingot was processed into a 3-inch, 6 mmφ target. The average crystallite size calculated from Scherrer's formula regarding the obtained target was 140 to 850 Å (14 to 85 nm) as shown in Table 1, respectively.

Figure 4:
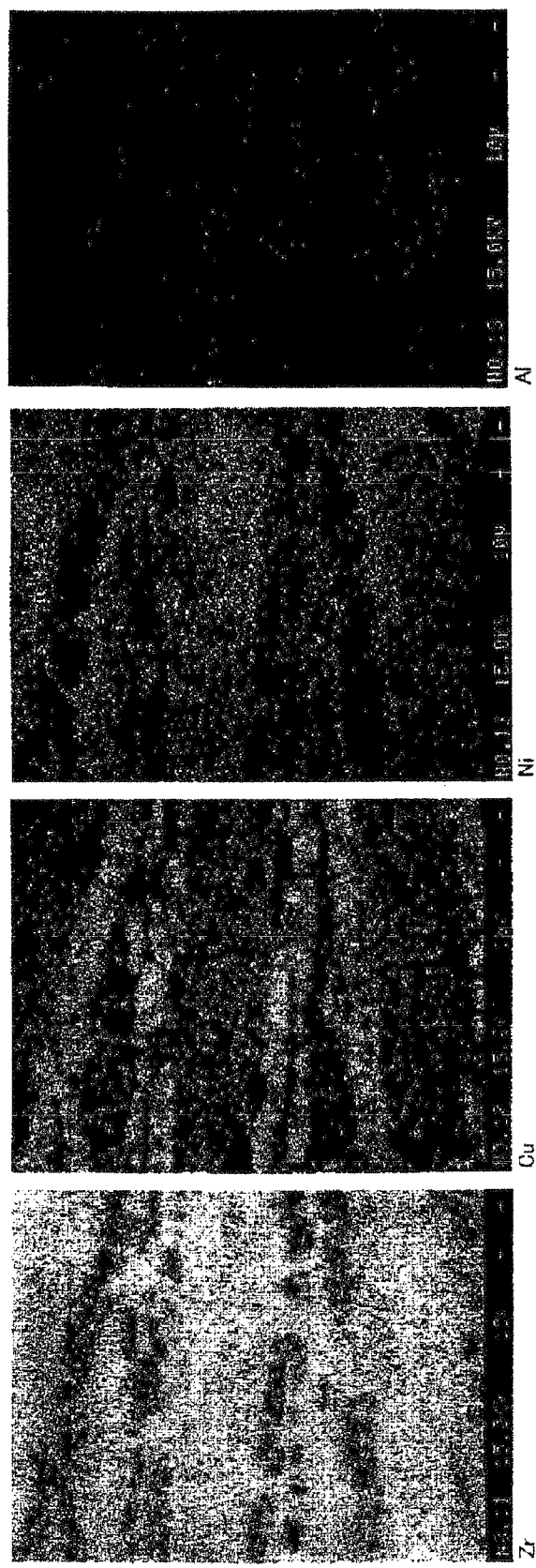
FIG. 4 is a diagram showing the segregation state of the respective elements based on EPMA of the target of Comparative Example 1.

Further, evaluation of the segregation state of Comparative Example 1 based on EPMA is shown in FIG. 4. In other words, segregation was severe in the constituent elements contained in the Comparative Examples, and the obtained target lacked uniformity. The other Comparative Examples attained the same results (not shown).

Figure 5:
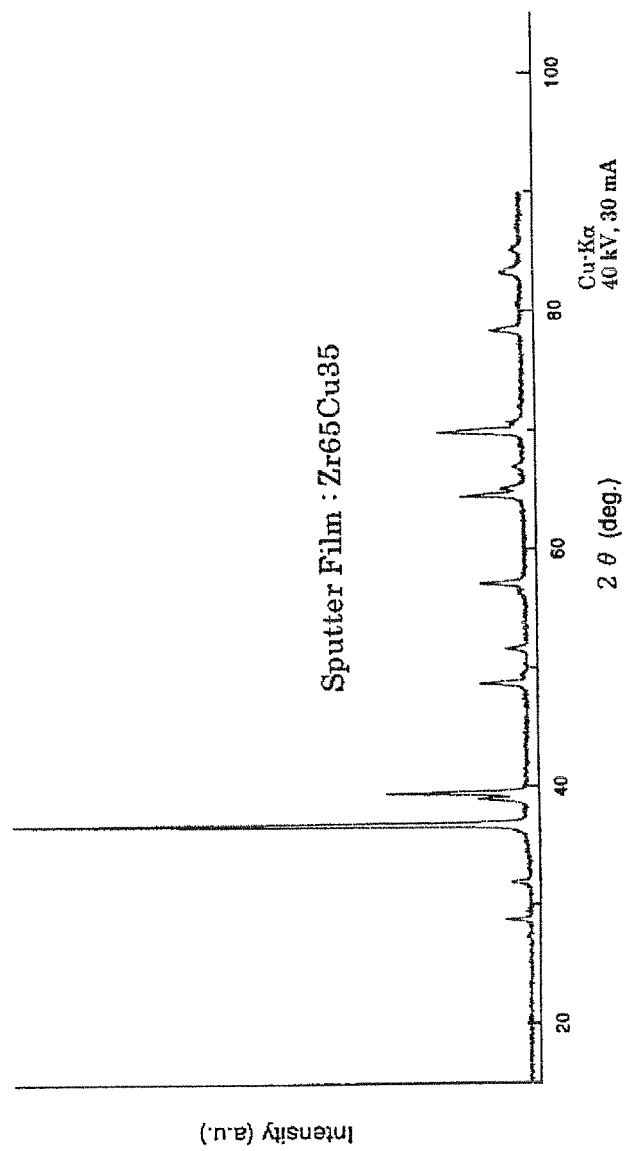
FIG. 5 is a diagram showing the XRD measurement result of the membrane when sputtering is performing with the target of Comparative Example 4.

Subsequently, using this target, DC sputtering was performed under the conditions of pure Ar, 0.5 Pa and 300 W in order to form a membrane. The film thickness after deposition was 1.1 μm. The sputtered membrane was subject to XRD measurement. A crystalline film was formed in each of the cases of Comparative Examples 4, 5, 6, 7 and 8. The results of Comparative Example 4 are representatively shown in FIG. 5.

Although an amorphous membrane was formed in Comparative Examples 1-3 and Comparative Examples 9-12, the surface roughness after sputtering was coarse at 0.87 to 3.52 μm, and the average crystallite size was also large in comparison to the Examples at 140 to 800 Å.

In each of the foregoing cases, blackish nodules were observed in the target after sputtering. Further, defects deemed to be the cause of nodules were observed in the membrane.

|  | Composition | Atomized Powder D50 μm | Relative Density % | Average Crystallite Size Å | Surface Roughness of Target after Sputtering μm | Crystal Condition of Sputtered Membrane |
|---|---|---|---|---|---|---|
| Example1 | Zr65Al7.5Ni10Cu17.5 | 39 | 98.2 | 14 | 0.25 | Amorphous |
| Example2 | Pd78Cu6Si16 | 45 | 97 | 10 | 0.12 | Amorphous |
| Example3 | Cu60Zr30Ti10 | 34 | 98.3 | 12 | 0.34 | Amorphous |
| Example4 | Co72.5Al12.5B15 | 40 | 96.4 | 18 | 0.2 | Amorphous |
| Example5 | Fe70Zr10B20 | 36 | 98.8 | 20 | 0.18 | Amorphous |
| Example6 | Pd50Cu15Si35 | 42 | 97.4 | 17 | 0.12 | Amorphous |
| Example7 | Ni35Nb35Zr30 | 39 | 95.5 | 120 | 0.24 | Amorphous |
| Example8 | Ni35Ta35Zr30 | 40 | 96.8 | 110 | 0.26 | Amorphous |
| Comparative Example1 | Zr65Al7.5Ni10Cu17.5 | — | 99.8 | 350 | 0.87 | Amorphous |
| Comparative Example2 | Zr65Al7.5Ni10Cu17.5 | 39 | 98.2 | 800 | 1.42 | Amorphous |
| Comparative Example3 | Zr65Al7.5Ni10Cu17.6 | 103 | 98.4 | 320 | 3.52 | Amorphous |

| | Composition | Atomized Powder D50 μm | Relative Density % | Average Crystallite Size Å | Surface Roughness of Target after Sputtering μm | Crystal Condition of Sputtered Membrane |
|---|---|---|---|---|---|---|
| Comparative Example4 | Zr65Cu35 | 45 | 95.5 | 350 | 1.1 | Crystalline |
| Comparative Example5 | Pd78Si22 | 43 | 96.2 | 850 | 2.51 | Crystalline |
| Comparative Example6 | Cu60Ti40 | 58 | 95.1 | 140 | 3.42 | Crystalline |
| Comparative Example7 | Co72.5Al27.5 | 44 | 97.5 | 260 | 1.23 | Crystalline |
| Comparative Example8 | Fe70Zr30 | 36 | 93.2 | 230 | 2.19 | Crystalline |
| Comparative Example9 | Pd78Cu6Si16 | 110 | 97.5 | 350 | 2.51 | Amorphous |
| Comparative Example10 | Cu60Zr30Ti10 | 182 | 96.4 | 420 | 3.42 | Amorphous |
| Comparative Example11 | Co72.5Al12.5B15 | 125 | 98.8 | 280 | 1.23 | Amorphous |
| Comparative Example12 | Fe70Zr10B20 | 138 | 97.9 | 260 | 2.19 | Amorphous |

The sputtering target for producing a metallic glass membrane according to the present invention yields a superior effect in that the obtained target has high density and a uniform structure according to the sintering method, and, when sputtering is performed using this target, the target surface after sputtering will become a smooth eroded surface, evenness (uniformity) of the film will be favorable, and there is hardly any generation of arcing or particles.

Further, the present invention yields significant effects in that it is possible to make the thickness of the thin membrane much thinner than the bulk body obtained from a conventional molten metal quenching method, the size of the thin membrane can be enlarged without limitation, and the thin membrane can be manufactured at low cost. The sputtered membrane obtained thereby is extremely useful in producing metallic glass.

We claim:

1. A method of manufacturing a sputtering target for producing a metallic glass membrane, comprising the steps of sintering atomized powder having an average grain size of 50 μm or less and having a metallic glass composition of a ternary or more alloy system with one or more metal elements selected from a group consisting of Pd, Zr, Fe, Co, Cu and Ni as its main constituent element or elements, the main constituent element or elements including a main component that is a component of greatest atomic % of the composition and the ternary or more alloy system being selected from the group consisting of Zr—Al—Ni—Cu, Pd—Cu—Si, Cu—Zr—Ti, Co—Al—B, Fe—Zr—B, Pd—Cu—Si, Ni—Nb—Zr, and Ni—Ta—Zr, said sintering step being conducted at a temperature between a glass transition point temperature and a crystallization temperature of the composition, and producing a sputtering target from the sintered body of atomized powder such that the sputtering target has an amorphous structure characterized by containing dispersed crystallites having an average size as measured by XRD (X-ray diffraction) of 10 Å to 200 Å.

2. A method of manufacturing a sputtering target for producing a metallic glass membrane, comprising the steps of:
producing atomized alloy powder having an average grain size of 50 μm or less and having a metallic glass composition of a ternary or more alloy system, the metallic glass composition including at least one metal element selected from a group consisting of Pd, Zr, Fe, Co, Cu and Ni as its main constituent element or elements, one of which is a main component of greatest atomic % of the composition; and
sintering the atomized alloy powder of the metallic glass composition at a sintering temperature between a glass transition point temperature and a crystallization temperature of the metallic glass composition to produce a sintered body sputtering target of a glass state having an ultra-fine nano-size uniform structure of crystallites with an average size as measured by XRD (X-ray diffraction) of 10 Å to 200 Å (1 to 20 nm);
wherein the alloy system is selected from the group consisting of Zr—Al—Ni—Cu, Pd—Cu—Si, Cu—Zr—Ti, Co—Al—B, Fe—Zr—B, Pd—Cu—Si, Ni—Nb—Zr, and Ni—Ta—Zr.

3. A method according to claim 2, wherein said atomized alloy powder has an average grain size of 42 μm or less.

4. A method according to claim 2, wherein said atomized alloy powder has an average grain size of 34 to 42 μm.

* * * * *